(12) United States Patent
Honda et al.

(10) Patent No.: US 7,916,049 B2
(45) Date of Patent: Mar. 29, 2011

(54) GROUP DELAY CHARACTERISTIC CORRECTING DEVICE AND GROUP DELAY CHARACTERISTIC CORRECTING METHOD

(75) Inventors: Atsushi Honda, Kawasaki (JP); Kaoru Yokoo, Kawasaki (JP); Yoji Ohashi, Kawasaki (JP); Mitsuhiro Azuma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 12/453,781

(22) Filed: May 21, 2009

(65) Prior Publication Data
US 2010/0060497 A1   Mar. 11, 2010

(30) Foreign Application Priority Data

Sep. 11, 2008   (JP) .................................. 2008-233438

(51) Int. Cl.
*H04M 1/06* (2006.01)

(52) U.S. Cl. ........................... 341/118; 375/324; 455/82

(58) Field of Classification Search .......... 341/118–155; 375/324, 316, 346, 455; 455/82, 84, 302, 455/318, 319, 324
See application file for complete search history.

(56) References Cited

U.S. PATENT DOCUMENTS

| | | | | |
|---|---|---|---|---|
| 6,057,723 A * | 5/2000 | Yamaji et al. | .................. | 327/237 |
| 6,334,051 B1 * | 12/2001 | Tsurumi et al. | ................ | 455/324 |
| 7,146,148 B2 * | 12/2006 | Ide | .................. | 455/302 |
| 7,218,685 B2 * | 5/2007 | Ide et al. | ........................ | 375/316 |
| 2001/0010704 A1 | 8/2001 | Schelstraete | | |

FOREIGN PATENT DOCUMENTS

| | | |
|---|---|---|
| JP | 62-227208 | 10/1987 |
| JP | 408139601 A * | 5/1996 |
| JP | 408139606 A * | 5/1996 |
| JP | 11-261303 | 9/1999 |
| JP | 2000-299652 | 10/2000 |
| JP | 2001-257564 | 9/2001 |

* cited by examiner

*Primary Examiner* — Lam T Mai

(74) *Attorney, Agent, or Firm* — Fujitsu Patent Center

(57) ABSTRACT

A disclosed group delay characteristic correcting device corrects group delay characteristics of an analog low-pass filter used to remove aliasing of a digital-analog converter or an analog-digital converter. The group delay characteristic correcting device includes a digital signal processing unit configured to have an all-pass phase circuit at a stage previous to the digital-analog converter or at a stage subsequent to the analog-digital converter so as to correct the group delay characteristics of the analog low-pass filter.

6 Claims, 13 Drawing Sheets

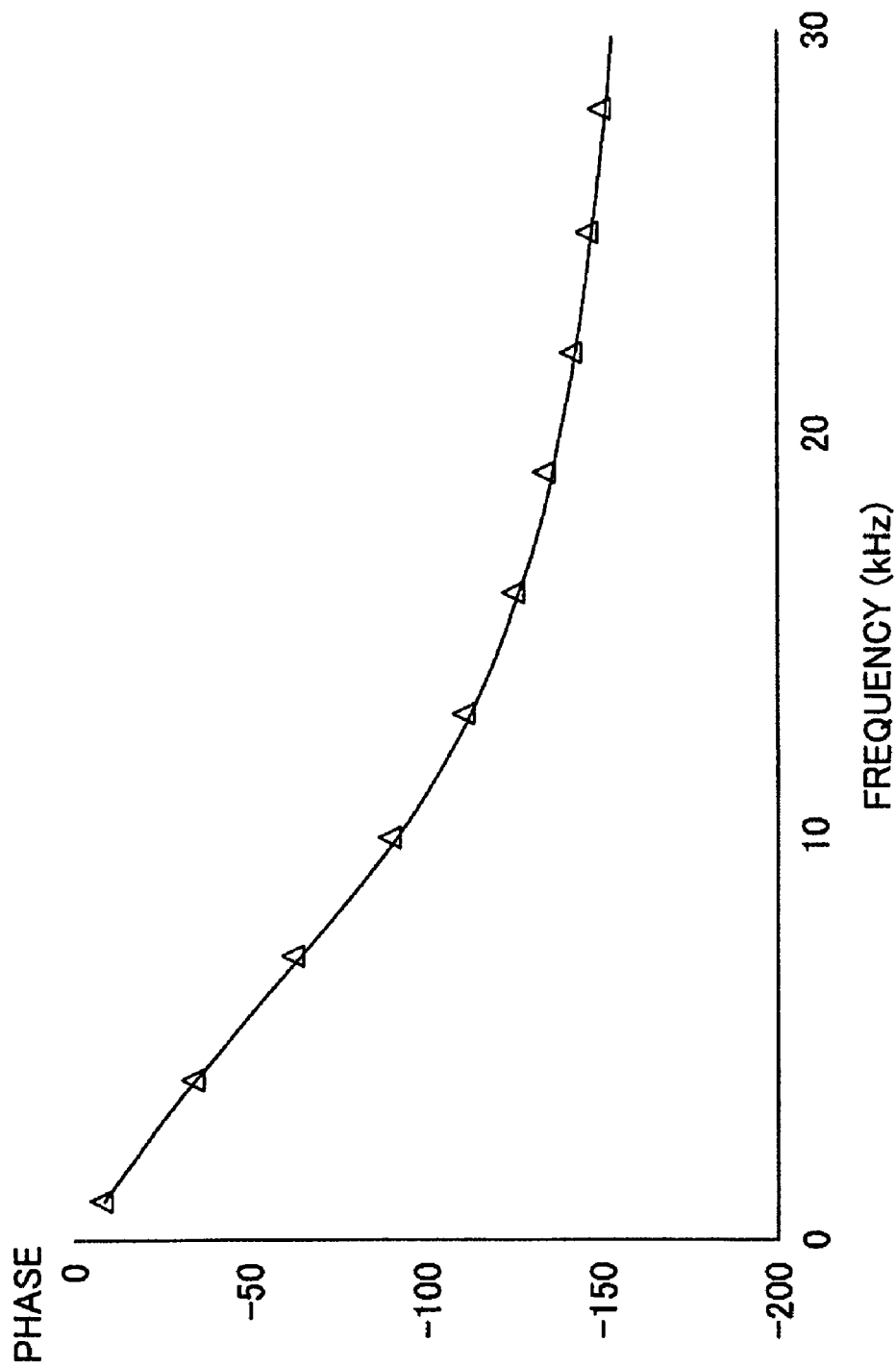

$a_1$=-0.5

$a_1$=-0.5

$a_1$=0.6, $a_2$=0.3

$a_1$=0.6, $a_2$=0.3

GROUP DELAY CHARACTERISTIC CORRECTING DEVICE AND GROUP DELAY CHARACTERISTIC CORRECTING METHOD

CROSS-REFERENCE TO RELATED APPLICATIONS

This application is based upon and claims the benefit of priority of Japanese Patent Application 2008-233438, filed on Sep. 11, 2008, the entire contents of which are hereby incorporated herein by reference.

FIELD

The present disclosure is directed to a group delay characteristic correcting device and a group delay characteristic correcting method for correcting group delay characteristics of an analog low-pass filter used for removing aliasing.

BACKGROUND

In order to remove aliasing, direct conversion transceivers, for example, require an analog low-pass filter (LPF) at a stage subsequent to a digital-analog converter (DAC) or at a stage previous to an analog-digital converter (ADC).

Transmission systems using millimeter-wave bands or broadband signals, such as UWB (Ultra Wide Band), have become more common in recent years, and therefore, demand has been raised for a large increase in the sampling rates of digital-analog converters and analog-digital converters.

For example, in the case where the baseband frequency is 600 MHz, a sampling rate of at least 1.2 GHz is required. Digital-analog converters and analog-digital converters having such sampling rates have already been in the marketplace; however, even when a 1.2 GHz digital-analog converter is used, aliasing occurs in the bandwidth between 600 and 1200 MHz. Therefore, unless aliasing in this bandwidth is removed by a low-pass filter, adjacent channel interference occurs. Similarly in the case of analog-digital converters, it is necessary to cut off adjacent channels in advance by a low-pass filter in order to prevent adjacent channel interference.

Low-pass filters used for this purpose need to have steep cut-off characteristics. Examples of common low-pass filters having steep cut-off characteristics are Chebyshev filters, inverse Chebyshev filters and elliptic filters. Although such a filter has a steep cut-off characteristic, phase linearity is lost particularly around the cutoff frequency, and the group delay characteristics are degraded.

In the case where the group delay characteristics of a filter are degraded, when an input waveform passes through the filter, an output waveform becomes distorted. As a result, significant degradation is observed in the transmission characteristics. Accordingly, methods for improving the group delay characteristics of low-pass filters have conventionally been studied.

One such method is to insert an equalizer in a transmitter to produce a preliminarily distorted output, thereby correcting the distortion caused when the input waveform passes through the low-pass filter (see Patent Documents 1 and 2, for example).

Another method suggests the use of an equalizer with such a filter that causes the group delay characteristics to have a concave shape in the middle of the spectral frequencies and have a convex shape at edges of the spectral frequencies (see Patent Document 3, for example).

Yet another method is to improve the group delay characteristics by devising the shape of an analog filter (see Patent Document 4, for example).

[Patent Document 1] Japanese Laid-open Patent Application Publication No. 2000-299652
[Patent Document 2] Japanese Laid-open Patent Application Publication No. 2001-257564
[Patent Document 3] Japanese Laid-open Patent Application Publication No. S62-227208
[Patent Document 4] Japanese Laid-open Patent Application Publication No. H11-261303

However, neither Patent Document 1 nor Patent Document 2 discloses a method for calculating the inverse characteristics of the group delay characteristics of the filter. The correction technique of Patent Document 3 is directed only to a filter whose group delay characteristics have a concave shape in the middle of the spectral frequencies and a convex shape at edges of the spectral frequencies.

The technique of Patent Document 4 requires a large cost since the analog filter itself is devised, and also leaves the problem of less design freedom in terms of the pass band, cutoff band and the like.

SUMMARY

According to an aspect of the invention, a group delay characteristic correcting device for correcting group delay characteristics of an analog low-pass filter used to remove aliasing of a digital-analog converter or an analog-digital converter. The group delay characteristic correcting device includes a digital signal processing unit configured to have an all-pass phase circuit at a stage previous to the digital-analog converter or at a stage subsequent to the analog-digital converter so as to correct the group delay characteristics of the analog low-pass filter.

The object and advantages of the disclosure will be realized and attained by means of the elements and combinations particularly pointed out in the claims.

It is to be understood that both the foregoing general description and the following detailed description are exemplary and explanatory and are not restrictive of the present disclosure as claimed.

BRIEF DESCRIPTION OF DRAWINGS

FIG. 7 is a phase characteristic diagram of the analog low-pass filter;

DESCRIPTION OF EMBODIMENT

Embodiments that describe the best mode for carrying out the present invention are explained next with reference to the drawings.

[Transmitter]

Figure 1:
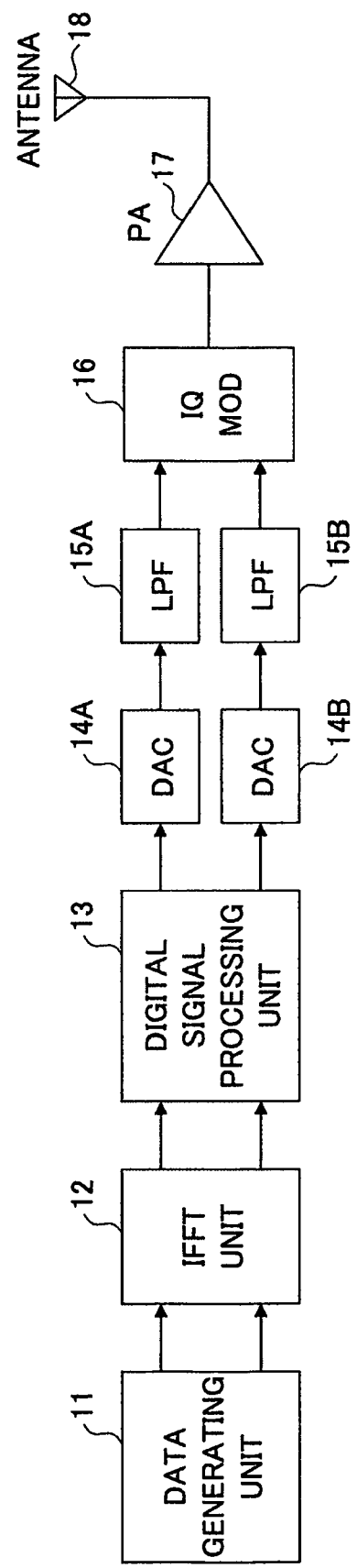
FIG. 1 is a block diagram of a transmitter according to one embodiment of the present disclosure.

FIG. 1 is a block diagram of a direct conversion transmitter according to one embodiment. The transmitter has a structure designed to be used in the OFDM (Orthogonal Frequency Division Multiplexing) scheme. In FIG. 1, a data generating unit 11 generates I data and Q data to be transmitted. The I and Q data are respectively converted from frequency-domain signals into time-domain signals at an IFFT (Inverse Fast Fourier Transform) unit 12, and then sent to a digital signal processing unit 13.

The digital signal processing unit 13 performs a signal process in order to improve the group delay characteristics of low-pass filters 15A and 15B operating at a subsequent stage. The I and Q data output from the digital signal processing unit 13 are converted into analog signals by digital-analog converters (DAC) 14A and 14B, respectively. Then, the low-pass filters (LPF) 15A and 15B remove unnecessary high-frequency components from the respective analog signals, thereby removing aliasing created by the digital-analog converters 14A and 14B.

Subsequently, a quadrature modulator (IQMOD) 16 modulates the carrier frequencies of the respective signals with the I and Q data, and a power amplifier (PA) 17 power-amplifies the modulated signals, which is then output from an antenna 18.

[Receiver]

Figure 2:
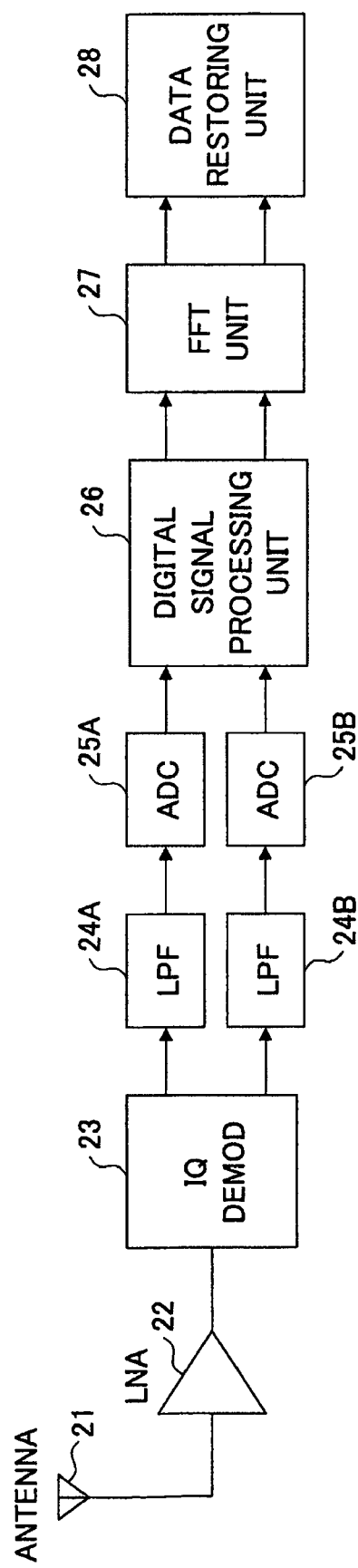
FIG. 2 is a block diagram of a receiver according to one embodiment of the present disclosure.

FIG. 2 is a block diagram of a direct conversion receiver according to one embodiment. The receiver has a structure designed to be used in the OFDM scheme. In FIG. 2, a signal received by an antenna 21 is amplified by a preamplifier (LNA) 22, and then supplied to a quadrature demodulator (IQDEMOD) 23, in which the signal is demodulated into I and Q signals.

Low-pass filters 24A and 24B remove unnecessary high-frequency components from the respective I and Q signals, respectively, thereby preventing aliasing otherwise created by analog-digital converters (ADC) 25A and 25B. Subsequently, the signals are digitized by the analog-digital converters (ADC) 25A and 25B, and then supplied to a digital signal processing unit 26.

The digital signal processing unit 26 performs a signal process in order to improve the group delay characteristics of the low-pass filters 24A and 24B. I and Q data output from the digital signal processing unit 26 are respectively converted from time-domain signals into frequency-domain signals at an FFT (Fast Fourier Transform) unit 27, and then supplied to a data restoring unit 28, in which the signals are restored to original data.

[Design of Digital Signal Processing Unit]

Figure 3:
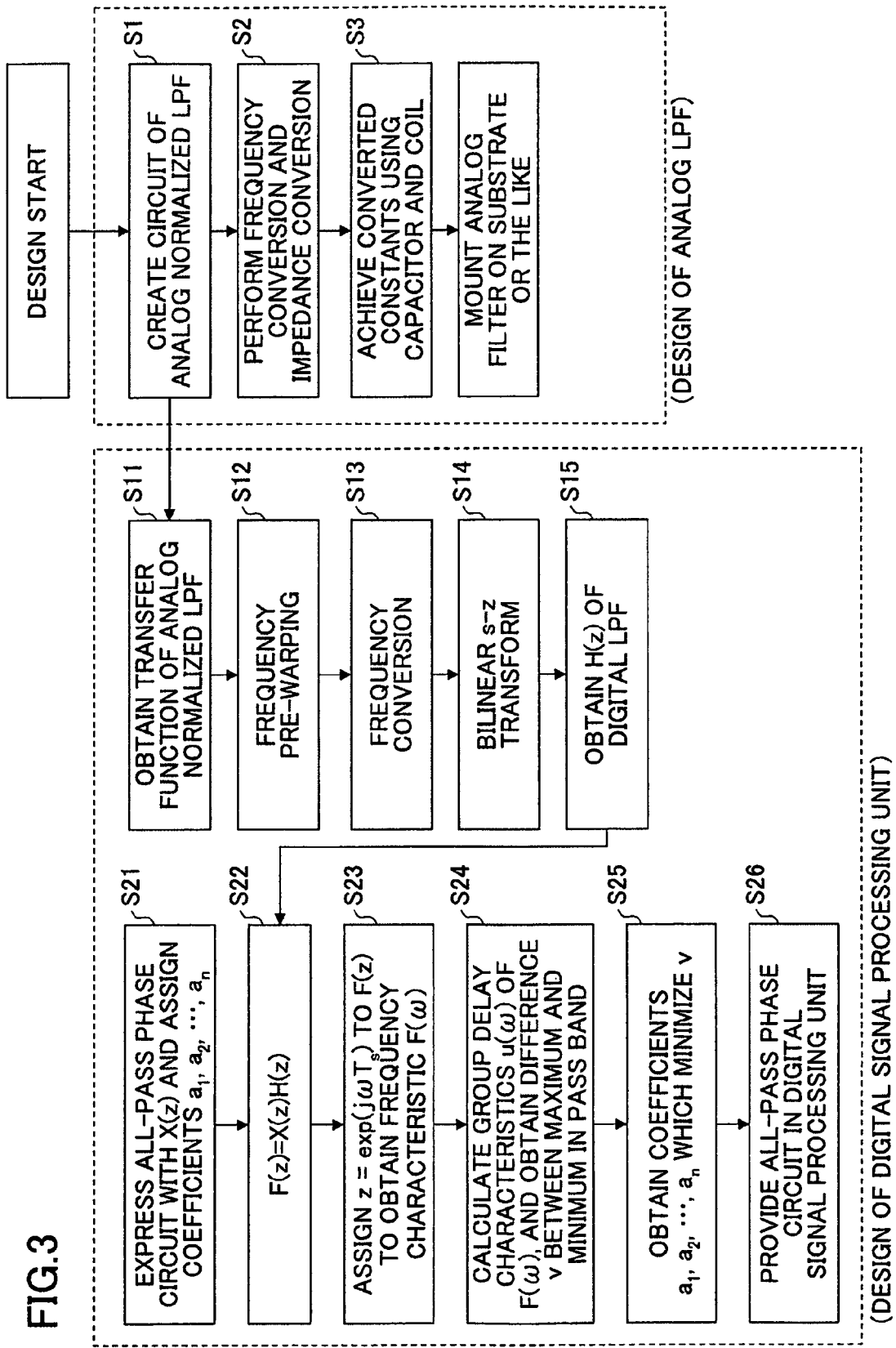
FIG. 3 is a flowchart of a process of designing a digital signal processing unit according to one embodiment of the present disclosure.

FIG. 3 is a flowchart showing a process of designing the digital signal processing units 13 and 26. In Step S1 of FIG. 3, the analog low-pass filters 15A and 15B (or 24A and 24B) having desired characteristics are designed. In this example, assume that each of the low-pass filters 15A and 15B (or 24A and 24B) is a second-order Butterworth analog low-pass filter having a cutoff frequency of 10 kHz.

An analog low-pass filter is generally designed using data normalized to a cutoff frequency of $1/2\pi$ and an impedance of $1\Omega$. Each of a band-pass filter (BPF), a high-pass filter (HPF) and a band elimination filter (BEF) can be created by changing values of a low-pass filter, and the same technique is employed to create them.

Figure 4:
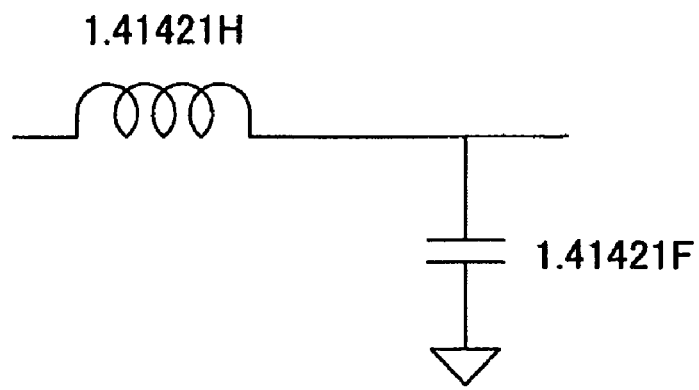
FIG. 4 is a structural diagram of a Butterworth normalized low-pass filter.

The second-order Butterworth normalized low-pass filter includes an inductance of 1.41421 [H] and a capacitance of 1.41421 [F], as illustrated in FIG. 4. Desired frequency and impedance for an analog low-pass filter can be obtained by the following equations. In Step S2, a frequency conversion coefficient M and an impedance conversion coefficient K are obtained.

$$M = \text{target frequency/original frequency as a reference}$$
$$= 10 \text{ kHz}/(1/2\Pi)$$
$$= 6.28 \times 10^4$$
$$K = \text{target impedance/original impedance as a reference}$$
$$= 50 \Omega/1 \Omega$$
$$= 50$$

Using M and K above, constants L and C are calculated in Step S3 by the following equations.

$$L = 1.42 \; [H] \times K/M$$
$$= 1.42 \; [H] \times 50/6.28 \times 10^4$$
$$\approx 1.13 \; kH$$
$$C = 1.42 \; [F]/(M \times K)$$
$$= 1.42 \; [F]/(6.28 \times 10^4 \times 50)$$
$$\approx 452.23 \; nF$$

Figure 5:
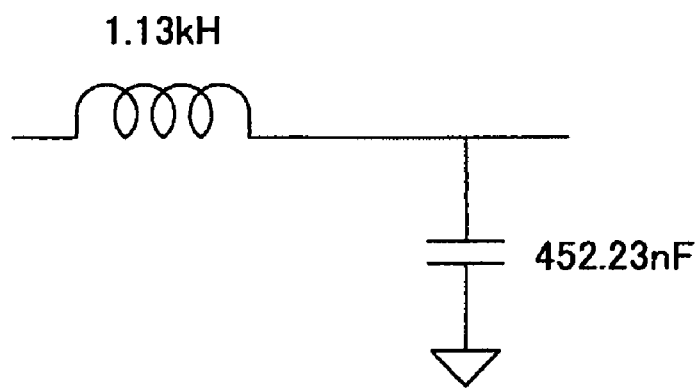
FIG. 5 is a structural diagram showing a designed analog low-pass filter.
Figure 6:
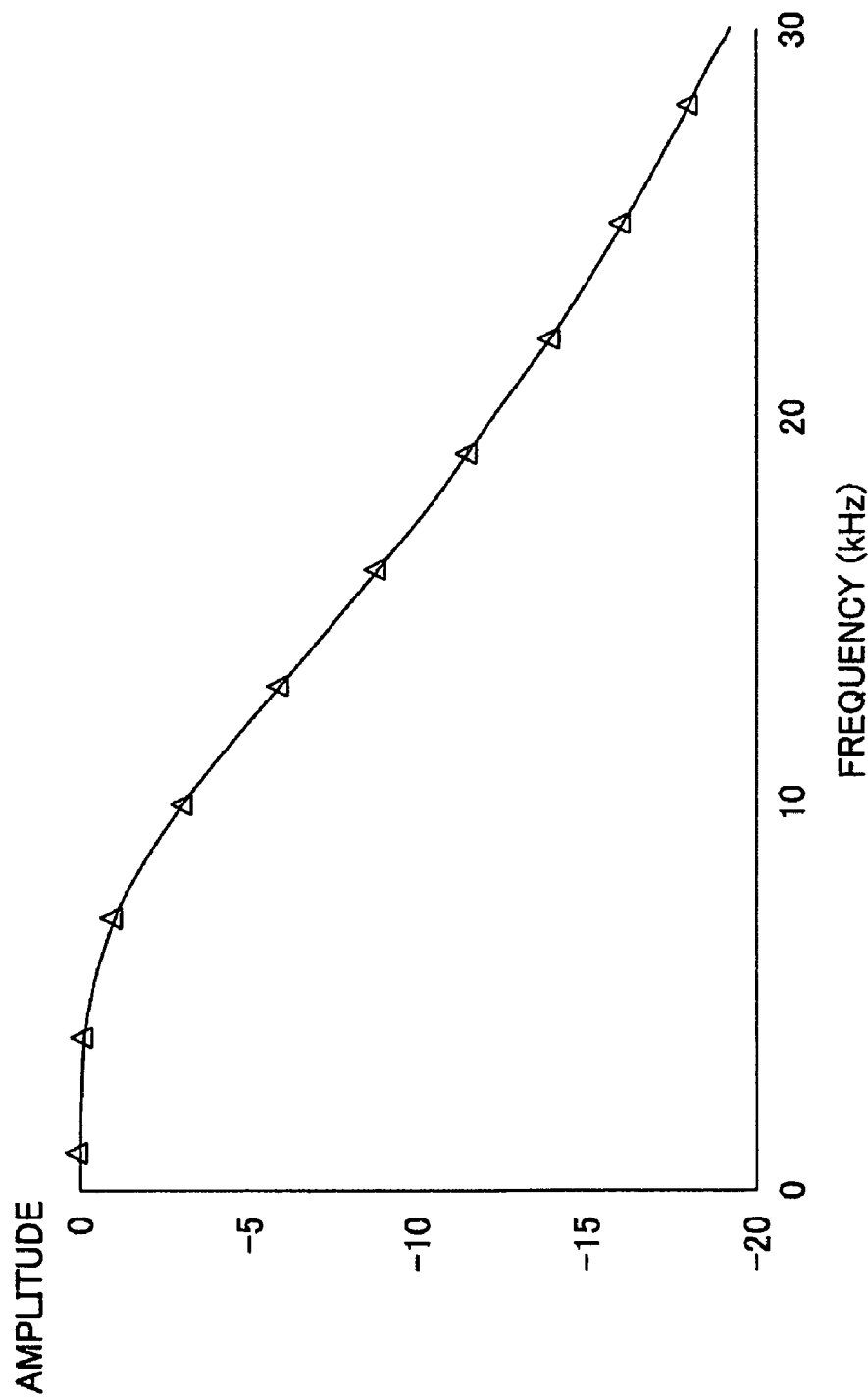
FIG. 6 is an amplitude characteristic diagram of the analog low-pass filter.

FIG. 5 shows an analog low-pass filter designed in the above manner. Frequency characteristics (amplitude characteristic and phase characteristic) are calculated by incorporating the analog low-pass filter in a circuit simulator. The results of the calculation are illustrated in FIGS. 6 and 7.

Next, the analog low-pass filter is digitized. In Step S11, a formulated transfer function G(s) is obtained for the analog normalized low-pass filter. The transfer function G(s) is obtained by an expression s=jω, where ω=2πf(rad/sec), and f is the frequency [Hz]. In this step, the transfer function having amplitude and phase information is derived from the amplitude characteristic. In the case of a Butterworth analog low-pass filter, the amplitude characteristic is expressed as follows.

$$|G(\omega)|^2 = 1/(1+\epsilon^2\omega^{2N})$$

$\epsilon$ is found by $\epsilon=(10_{AC}-1)^{1/2}$, where AC is an amount of attenuation at the cutoff frequency, which is generally 3 dB. In this case, $\epsilon=1$.

In order to calculate G(s), ω=s/j is obtained from s=jω, and then substituted into the above equation of $|G(\omega)|^2$.

$$|G(s)|^2 = |G(s)G(-s)|$$
$$= 1/[1+(-js)^{2N}]$$
$$= 1/[1+(-s^2)^N]$$

s to make the above denominator zero, i.e. a pole, is calculated.

In the case where N is an odd number, the following is obtained by solving $s^{2N}=1$.

$$s_k = e^{jk\Pi/N}$$
$$= \cos(k\Pi/N) + j\sin(k\Pi/N)$$
$$(k = 0, 1, 2, \ldots, 2N-1)$$

In the case where N is an even number, the following is obtained by solving $s_{2N}=-1$.

$$s_k = e^{j(2k+1)\Pi/2N}$$
$$= \cos[(2k+1)\Pi/2N] + j\sin[(2k+1)\Pi/2N]$$
$$(k = 0, 1, 2, \ldots, 2N-1)$$

Figure 8C:
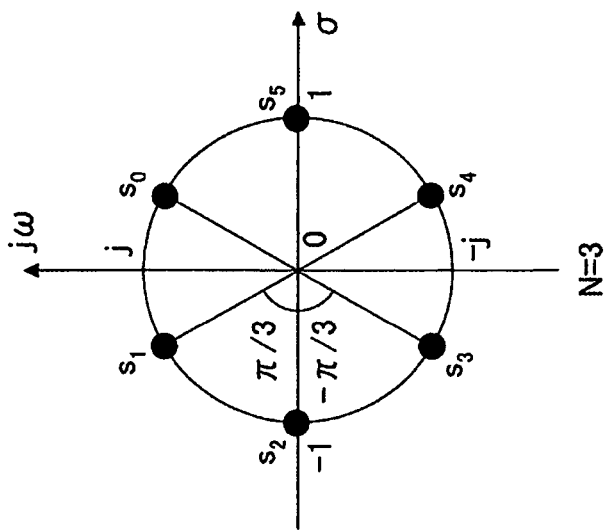
FIGS. 8A through 8C show polar locations of the Butterworth low-pass filter.
Figure 8B:
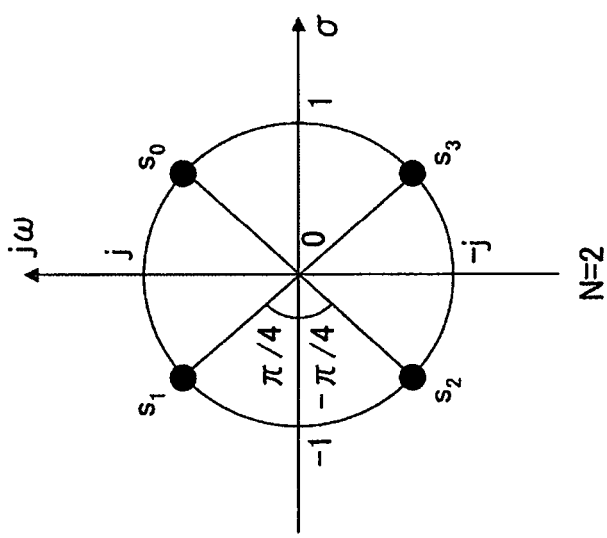
Figure 8A:
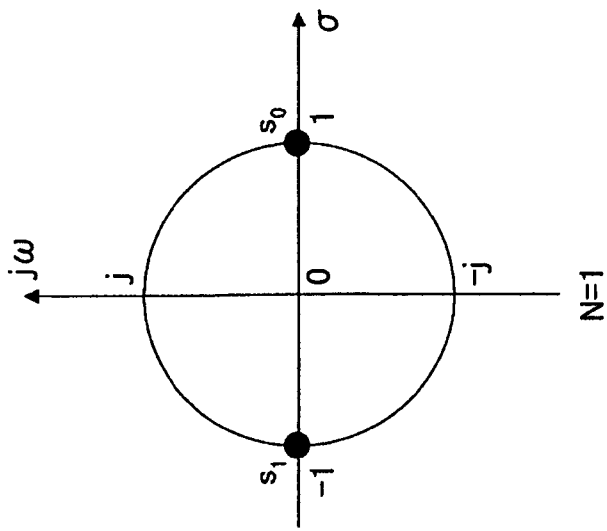

As for a Butterworth low-pass filter, all poles lie in s planes, on a unit circle at $\pi/N$ intervals, as illustrated in FIGS. 8A through 8C. FIG. 8A shows the case of N=1; FIG. 8B shows the case of N=2; and FIG. 8C shows the case of N=3. All poles are obtained from $G(s)G(-s)$, and a transfer function including only poles on the left-hand half-plane is stable.

In the case of N=1, since a stable pole is $s_1=-1$, $G(s)=1/(s+1)$.

In the case of N=2, since stable poles are $s_1=e^{3\pi/4}$ and $s_2=e^{5\pi/4}$, $$G(s) = 1/[(s-s_1)(s-s_2)]$$
$$= 1/[s^2 + \sqrt{2}s + 1].$$

In the case of N=3, since stable poles are $s_2=e^{2\pi/3}$, $s_3=-1$ and $s_4=e^{4\pi/3}$, $$G(s) = 1/[(s-s_3)(s-s_1)(s-s_2)]$$
$$= 1/[(s+1)(s^2+s+1)].$$

Even if the order of N is increased more than 3, the transfer function of the analog normalized low-pass filter can be obtained. The frequency characteristics of the analog low-pass filter are calculated using $s=j\omega$.

[Frequency Pre-Warping]

In order to approximate the analog normalized low-pass filter with an IIR (Infinite Impulse Response) digital low-pass filter, a frequency conversion and a bilinear s-z transform are performed; however, prior to these processes, frequency pre-warping is required in Step S12.

In the bilinear s-z transform, $s=(2/T_s)[(1-z^{-1})/(1+z^{-1})]$ needs to be calculated; however, because of $s=j\omega_A$ for the analog angular frequency and $z=\exp(j\omega_D T_s)$ for the digital angular frequency, the relationship $\omega_A=(2/T_s)\tan[(\omega_D T_s)/2]$ is obtained from $j\omega_A=(2/T_s)[1-(\exp(j\omega_D T_s))^{-1}/1+(\exp(j\omega_D T_s))^{-1}]$.

That is, by performing the frequency pre-warping, the following equation is satisfied in the case where the cutoff frequency of a digital low-pass filter is desired to be $\omega_C=10$ kHz.

$$\omega_{C, Analog} = (2/T_s)\tan[(\omega_C T_s)/2]$$

In order to do the design using the analog normalized low-pass filters, $\omega_{C, Analog}$ is used as the cutoff frequency below.

[Frequency Conversion]

In the frequency conversion using the analog normalized low-pass filters, $s=s/\omega_C$ is used as the conversion equation. In Step S13, the frequency conversion is performed by assigning the conversion equation in the equation of the normalized low-pass filter. In the case of N=2, the frequency conversion is as follows.

$$G(s) = 1/[s^2 + \sqrt{2}s + 1]$$
$$= 1/[(s/\omega_C)^2 + \sqrt{2}(s/\omega_C) + 1]$$

[Bilinear s-z Transform]

Next in Step S14, the bilinear s-z transform is performed, and the analog low-pass filter is converted into a digital low-pass filter (Step S15). As described above, the equation of the bilinear s-z transform is $s=(2/T_s)[(1-Z^{-1})/(1+Z^{-1})]$. This is substituted into the equation of the normalized low-pass filter as follows.

$$H(z)=1/[\{(2/T_s)[(1-z^{-1})/(1+z^{-1})]\}^2+\sqrt{2}s\{(2/T_s)[(1-z^{-1})/(1+z^{-1})]\}+1]$$

In order to obtain a frequency characteristic $H(\omega)$ of $H(z)$, $z=\exp(j\omega T_s)$ is substituted into the above equation.

Figure 9:
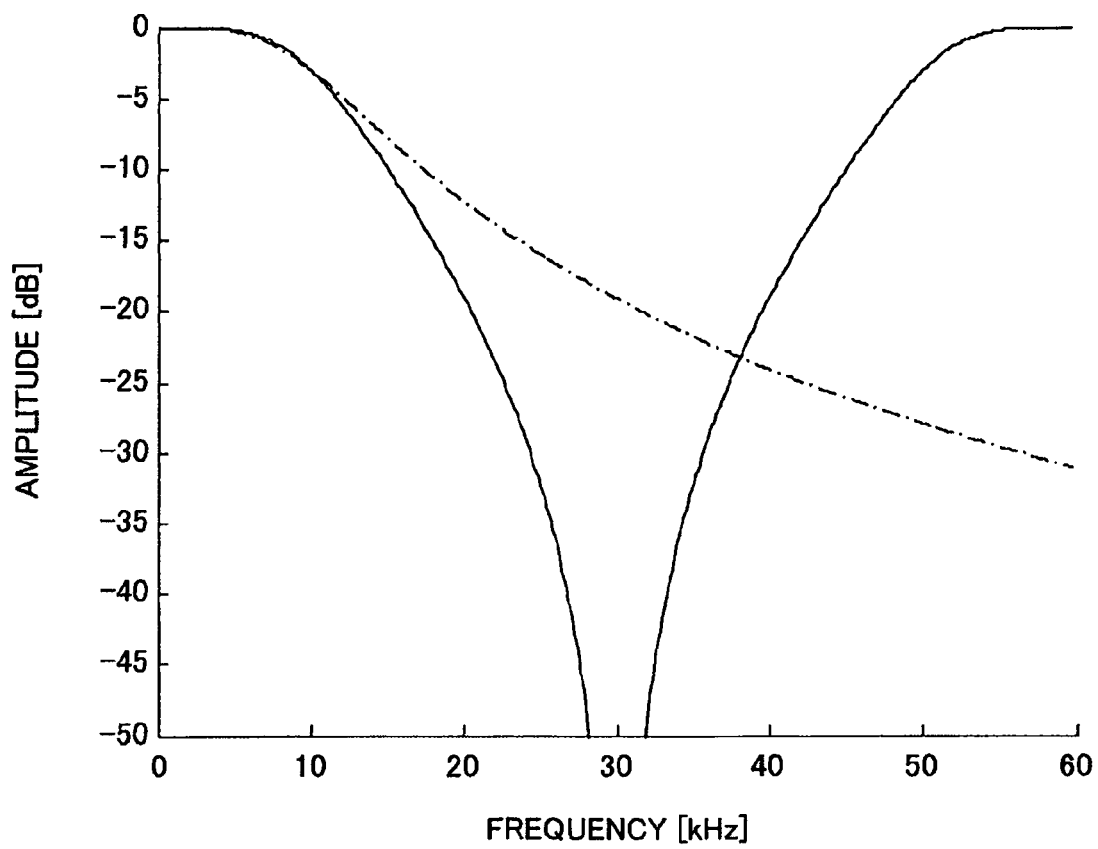
FIG. 9 shows amplitude frequency characteristics of an analog low-pass filter and a digital low-pass filter.
Figure 10:
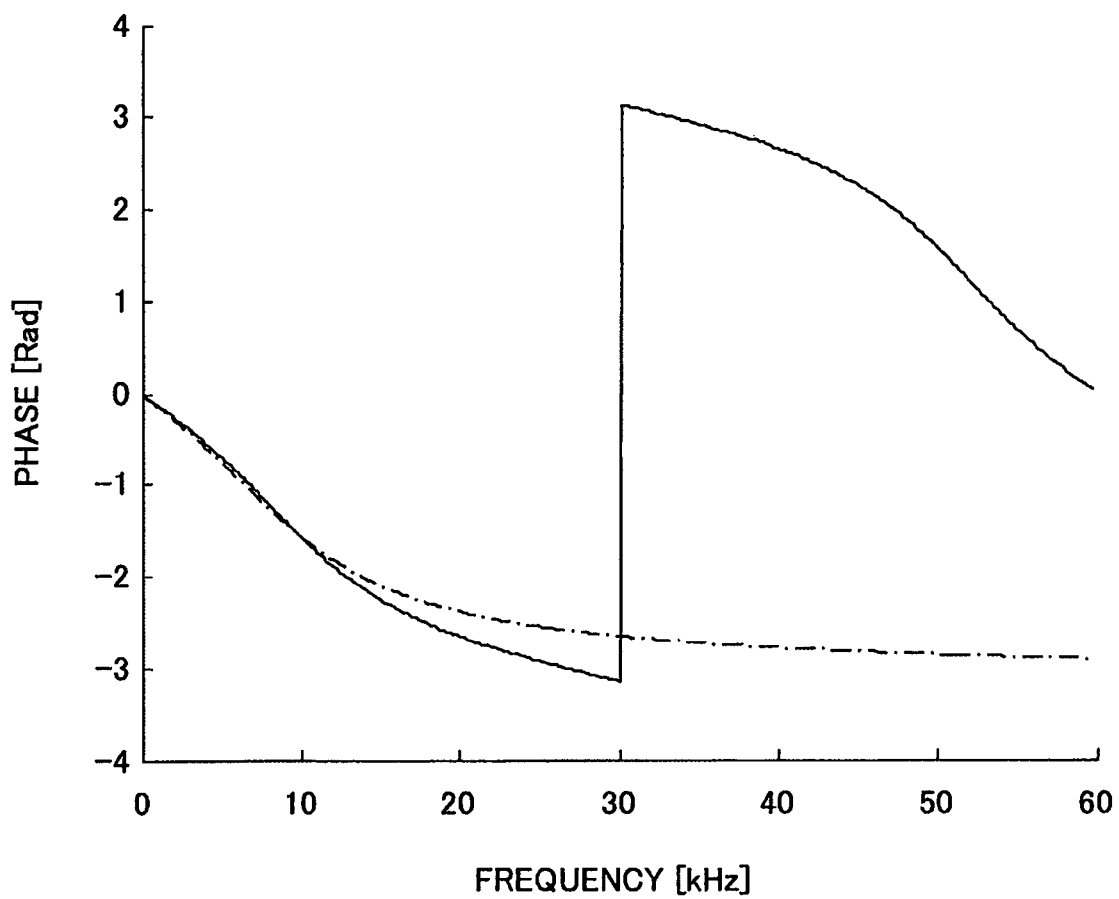
FIG. 10 shows phase frequency characteristics of the analog low-pass filter and the digital low-pass filter.

FIG. 9 shows amplitude frequency characteristics of an analog low-pass filter and a digital low-pass filter which approximates the analog low-pass filter. FIG. 10 shows phase frequency characteristics of the analog low-pass filter and the digital low-pass filter. The analog low-pass filter is indicated by the dashed-dotted line, and the digital low-pass filter is indicated by the solid line. The cutoff frequency is 10 kHz, and both the amplitude and phase exhibit substantially matched characteristics in the signal pass band.

Next is described correction of the phase characteristic performed by an all-pass phase circuit.

[Setting of All-Pass Phase Circuit]

In order to correct the phase characteristic of the analog low-pass filter, an all-pass phase circuit (also referred to as "all-pass filter") is provided. The all-pass phase circuit is expressed by the following equation (Step S21).

$$X(z) = \frac{z^{-N} + a_1 z^{-(N-1)} + a_2 z^{-(N-2)} \ldots + a_N}{1 + a_1 z^{-1} + a_2 z^{-2} + \ldots + a_N z^{-N}} \quad [\text{Equation 1}]$$

$$= \frac{1 + \sum_{n=1}^{N} a_n z^{-(N-n)}}{1 + \sum_{n=1}^{N} a_n z^{-n}}$$

The all-pass phase circuit has an amplitude characteristic of 1 in all frequency bands, and is capable of providing a desired phase characteristic by setting coefficients $a_n$.

In order to design an all-pass phase circuit, first, the order of the circuit needs to be determined. A larger order allows finer phase adjustments. For example, the following shows a first-order, a second-order and a third-order all-pass phase circuit.

First Order: $X(z)=(z^{-1}+a_1)/(1+a_1 z^{-1})$
Second Order: $X(z)=(z^{-2}+a_1 z^{-1}+a_2)/(1+a_1 z^{-1}+a_2 z^{-2})$
Third Order: $X(z)=(z^{-3}+a_1 z^{-2}+a_2 z^{-1}+a_3)/(1+a_1 z^{-1}+a_2 z^{-2}+a_3 z^{-2})$ As the order of z increases, finer phase adjustments can be made; however, with the increase in the order of z, the digital circuit increases in size, and the time delay of the entire signal also increases. Therefore, the all-pass phase circuit should be designed with an appropriate order.

Figure 11A:
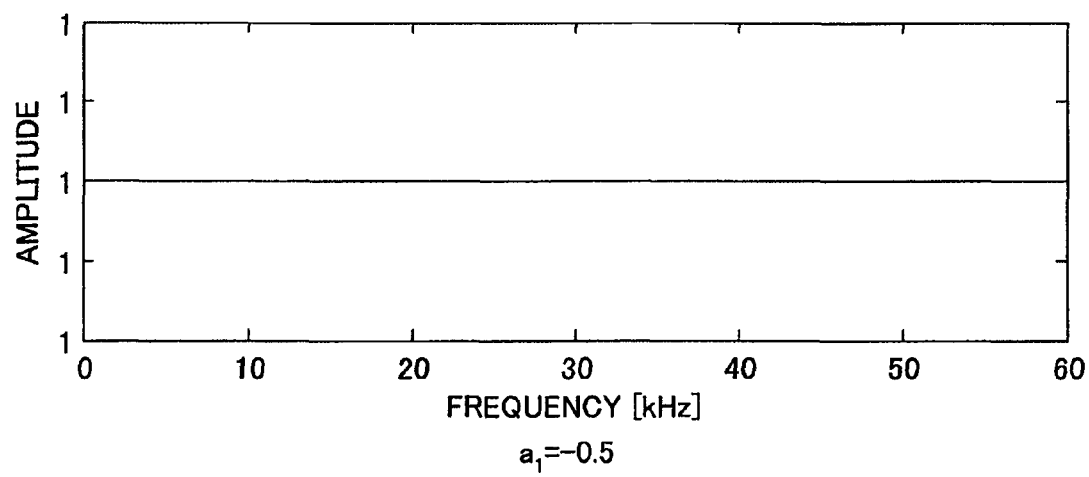
FIGS. 11A and 11B show amplitude and phase frequency characteristics of a first-order all-pass phase circuit.
Figure 11B:
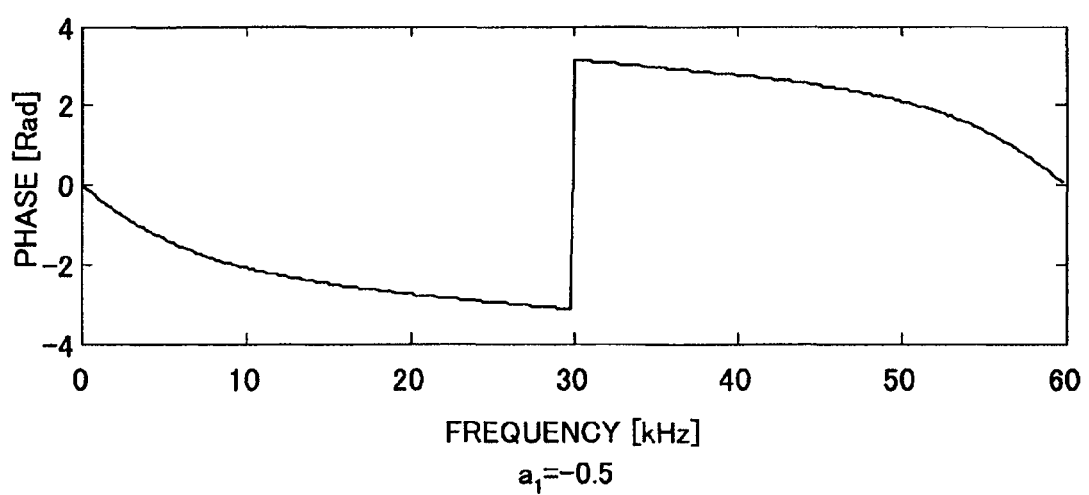
Figure 12A:
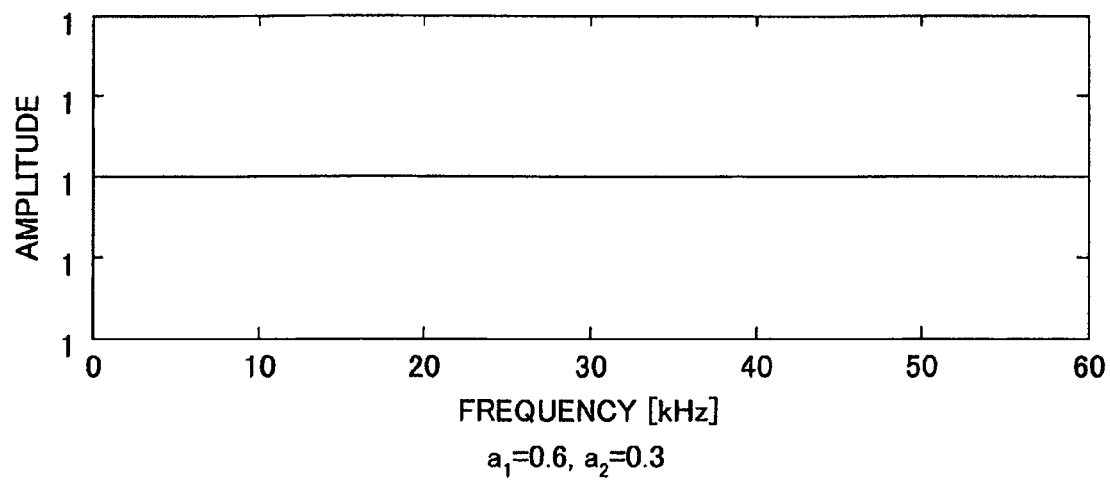
FIGS. 12A and 12B show amplitude and phase frequency characteristics of a second-order all-pass phase circuit.
Figure 12B:
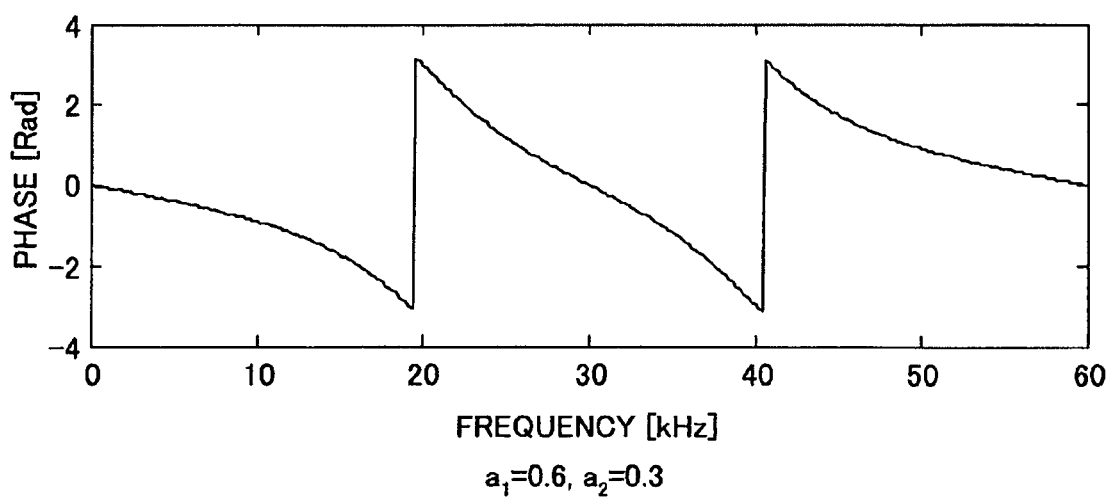

FIGS. 11A and 11B show amplitude and phase frequency characteristics of a first-order all-pass phase circuit ($a_1$ 32 −0.5), and FIGS. 12A and 12B show amplitude and phase frequency characteristics of a second-order all-pass phase circuit ($a_1$=0.6 and $a_2$=0.3). The following describes designing in which a second-order all-pass phase circuit is used.

[Characteristics Obtained When Digital Low-pass Filter and All-pass Phase Circuit are Cascade-connected]

In Step S22, a transfer function F(z) of a cascade-connected filter, in which the second-order all-pass phase circuit is cascade-connected to a digital low-pass filter, is obtained.

$$F(z)=X(z)H(z)$$

F(z) is calculated as follows.

$$F(z) = X(z)H(z) \quad \text{[Equation 2]}$$
$$= \frac{z^{-2}+a_1 z^{-1}+a_2}{1+a_1 z^{-1}+a_2 z^{-2}} \times \frac{1}{\left(\frac{2}{\omega_C T_S} \cdot \frac{1-z^{-1}}{1+z^{-1}}\right)^2 + \sqrt{2}\left(\frac{2}{\omega_C T_S} \cdot \frac{1-z^{-1}}{1+z^{-1}}\right) + 1}$$

The all-pass phase circuit is designed to have flat group delay characteristics of F(z). In Step S23, the frequency characteristic is obtained by substituting $z=\exp(j\omega T_s)$ into F(z), and a phase angle $\angle F(\omega)$ is obtained.

$$\angle F(\omega) = \angle \left\{ \frac{\frac{z^{-2}+a_1 z^{-1}+a_2}{1+a_1 z^{-1}+a_2 z^{-2}} \times \frac{1}{\left(\frac{2}{\omega_C T_S} \cdot \frac{1-z^{-1}}{1+z^{-1}}\right)^2 + \sqrt{2}\left(\frac{2}{\omega_C T_S} \cdot \frac{1-z^{-1}}{1+z^{-1}}\right) + 1}}{} \right\}, \quad \text{[Equation 3]}$$

$(z = \exp(j\omega T_S))$

[Calculation of Group Delay Amount $u(\omega)$ and Setting of Evaluation Function v]

A group delay amount $u(\omega)$ can be obtained from the following equation using an increase of the phase angle $d\angle F(\omega)$ and an increase in the angular frequency $d\omega$ (Step S24).

$$u(\omega)=-d\angle F(\omega)/d\omega$$

Since the group delay characteristics in the signal pass band should eventually become flat, the difference between the maximum value and the minimum value of the group delay in the signal pass band is calculated, and the difference is used as an evaluation function v to be minimized. For example, for a low-pass filter having a cutoff frequency of 10 kHz, the difference between the maximum value and the minimum value of the group delay amount is calculated in the range between 0 Hz and 10 kHz.

$$v=u(\omega)_{max}-u(\omega)_{min} \ (\omega \text{ is the signal pass band})$$

[Calculation of Coefficients $a_n$]

In Step S25, the coefficients $a_n$ of the all-pass phase circuit, which minimize the evaluation function v, are calculated. If the coefficients $a_n$ are set only at the stage of designing the analog low-pass filter and the all-pass phase circuit, the minimum value of the evaluation function v can be obtained by calculating the evaluation function v for all combinations of the coefficients $a_n$. In the case of the second-order all-pass phase circuit, for example, the evaluation function v is calculated for all combinations of the coefficients $a_n$ when $-1 \leq a_1 \leq 1$ and $-1 \leq a_2 \leq 1$.

[Calculation Example]

Figure 13A:
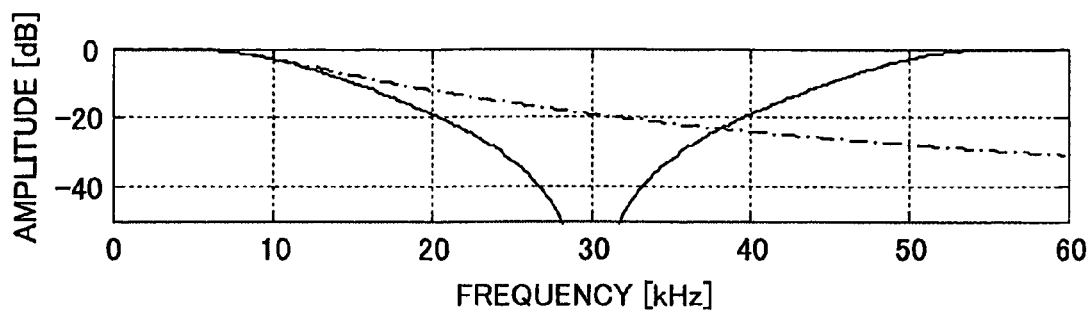
FIGS. 13A and 13B show characteristics of the analog low-pass filter and an all-pass-phase-circuit cascade-connected filter, obtained by a simulation.
Figure 13B:
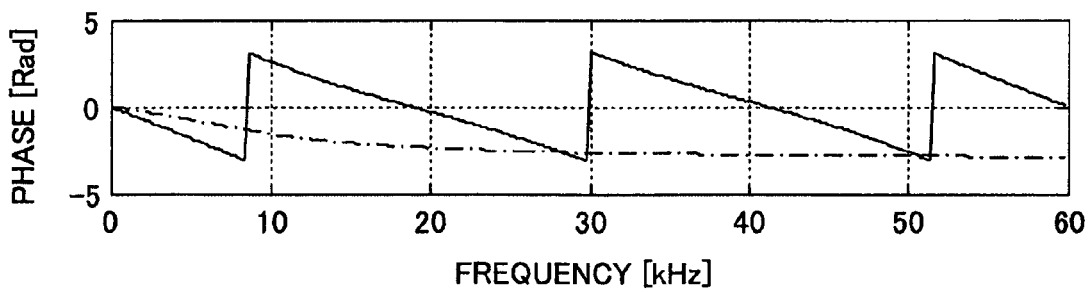
Figure 14:
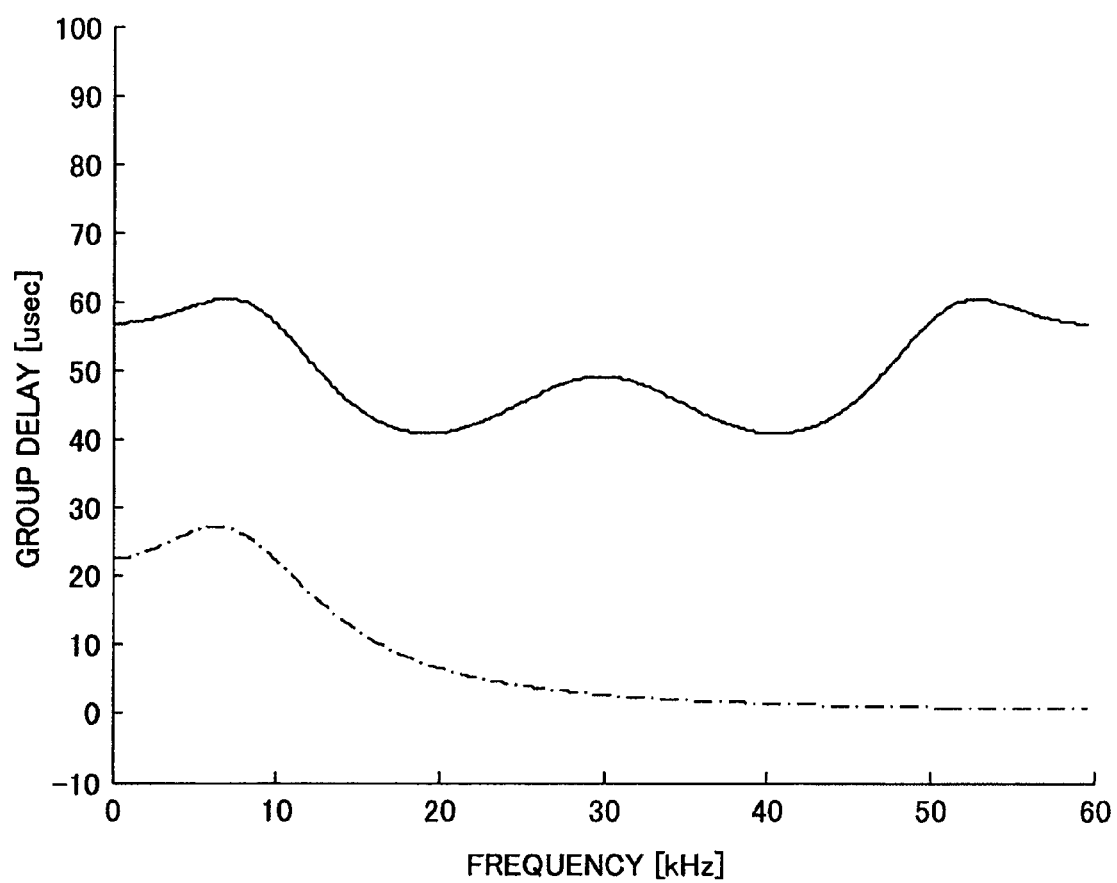
FIG. 14 shows group delay frequency characteristics of the analog low-pass filter and the cascade-connected filter, obtained by a simulation.

FIGS. 13 and 14 relate to the analog low-pass filter and the cascade-connected filter, in which the all-pass phase circuit is cascade-connected to the digital low-pass filter as designed in the above embodiment, and show their characteristics obtained by a simulation. As illustrated in FIG. 13A, in the signal pass band, the amplitude frequency characteristic of the cascade-connected filter indicated by the solid line matches the characteristic of the analog low-pass filter indicated by the dashed-dotted line. In FIG. 13B, the phase frequency characteristic of the cascade-connected filter exhibits linearity.

FIG. 14 shows group delay frequency characteristics of the analog low-pass filter and the cascade-connected filter obtained by a simulation. In the signal pass band (10 kHz and lower), the cascade-connected filter indicated by the solid line exhibits a flat group delay characteristic compared to the analog low-pass filter indicated by the dashed-dotted line. Note that the values of $a_1$ and $a_2$ in this case are 0.0700 and −0.0800.

In Step S26, the all-pass phase circuit defined by the coefficients $a_1$, $a_2$, . . . , and $a_n$ obtained as described above is set in the digital signal processing unit 13 (or 26).

In this manner, it is possible to readily correct the group delay characteristics of the analog low-pass filter.

All examples and conditional language used herein are intended for pedagogical purposes to aid the reader in understanding the present disclosure and the concepts contributed by the inventor to furthering the art, and are to be construed as being without limitation to such specifically recited examples and conditions, nor does the organization of such examples in the specification relate to a showing of the superiority or inferiority of the present disclosure. Although the embodiments of the present disclosure have been described in detail, it should be understood that various changes, substitutions, and alterations could be made hereto without departing from the spirit and scope of the present disclosure.

What is claimed is:

1. A group delay characteristic correcting device for correcting group delay characteristics of an analog low-pass filter used to remove aliasing of a digital-analog converter or an analog-digital converter, the group delay characteristic correcting device including:
   a digital signal processing unit configured to have an all-pass phase circuit at a stage previous to the digital-analog converter or at a stage subsequent to the analog-digital converter so as to correct the group delay characteristics of the analog low-pass filter, wherein
   the all-pass phase circuit approximates the analog low-pass filter with a digital low-pass filter, and a coefficient of the all-pass phase circuit is set in such a manner that the group delay characteristics in a signal pass band becomes flat when the all-pass phase circuit is cascade-connected to the digital low-pass filter.

2. The group delay characteristic correcting device as claimed in claim 1, wherein the coefficient of the all-pass phase circuit is set so as to minimize a difference between a maximum value and a minimum value of the group delay characteristics in the signal pass band.

3. The group delay characteristic correcting device as claimed in claim 2, wherein the group delay characteristic correcting device is applied to a direct conversion transmitter.

4. The group delay characteristic correcting device as claimed in claim 2, wherein the group delay characteristic correcting device is applied to a direct conversion receiver.

5. A group delay characteristic correcting method for correcting group delay characteristics of an analog low-pass filter used to remove aliasing of a digital-analog converter or an analog-digital converter, the group delay characteristic correcting method including:

providing an all-pass phase circuit at a stage previous to the digital-analog converter or at a stage subsequent to the analog-digital converter so as to correct the group delay characteristics of the analog low-pass filter, wherein the all-pass phase circuit approximates the analog low-pass filter with a digital low-pass filter, and a coefficient of the all-pass phase circuit is set in such a manner that the group delay characteristics in a signal pass band becomes flat when the all-pass phase circuit is cascade-connected to the digital low-pass filter.

6. The group delay characteristic correcting method as claimed in claim 5, wherein the coefficient of the all-pass phase circuit is set so as to minimize a difference between a maximum value and a minimum value of the group delay characteristics in the signal pass band.

* * * * *